(12) United States Patent
Tanaka (10) Patent No.: US 7,728,483 B2
(45) Date of Patent: Jun. 1, 2010

(54) LAMB WAVE TYPE FREQUENCY DEVICE AND METHOD THEREOF

(75) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 570 days.

(21) Appl. No.: 11/668,220

(22) Filed: Jan. 29, 2007

(65) Prior Publication Data

US 2007/0188047 A1    Aug. 16, 2007

(30) Foreign Application Priority Data

Feb. 16, 2006  (JP)  .............................. 2006-039297
Aug. 1, 2006   (JP)  .............................. 2006-209507

(51) Int. Cl.
*H01L 41/08*    (2006.01)

(52) U.S. Cl. .............................. 310/313 R; 310/313 D (58) Field of Classification Search ............. 310/313 R, 310/344, 348
See application file for complete search history.

(56) References Cited

U.S. PATENT DOCUMENTS

| | | | | |
|---|---|---|---|---|
| 4,216,401 A | * | 8/1980 | Wagner | ................... 310/313 R |
| 4,454,440 A | * | 6/1984 | Cullen | ..................... 310/313 R |
| 5,006,749 A | * | 4/1991 | White | ..................... 310/323.03 |
| 5,129,262 A | * | 7/1992 | White et al. | ................... 73/599 |
| 7,067,956 B2 | * | 6/2006 | Imai et al. | ................. 310/313 D |
| 7,224,100 B2 | * | 5/2007 | Thiesen | ................... 310/313 R |
| 2002/0109224 A1 | | 8/2002 | Shimoe | |
| 2006/0001508 A1 | | 1/2006 | Ohara et al. | |

FOREIGN PATENT DOCUMENTS

| | | |
|---|---|---|
| EP | 1 471 636 A1 | 10/2004 |
| EP | 1 536 439 A1 | 6/2005 |
| EP | 1 585 218 A2 | 10/2005 |
| JP | A 10-233645 | 9/1998 |
| JP | A-2002-152007 | 5/2002 |
| JP | A 2003-258596 | 9/2003 |
| JP | A-2004-072204 | 3/2004 |
| WO | WO 2007/046236 A1 | 4/2007 |

OTHER PUBLICATIONS

Nakagawa, et al; (2004); "A Substrate for a Lamb Wave Type Surface Acoustic Wave Element" 33rd EM symposium; pp. 93 to 96.

(Continued)

*Primary Examiner*—Mark Budd
(74) *Attorney, Agent, or Firm*—Oliff & Berridge, PLC (57) ABSTRACT

A Lamb wave type high frequency device comprises: a piezoelectric substrate; an interdigital transducer (IDT) electrode formed on a first main surface of the piezoelectric substrates a reinforcing substrate connected to a second main surface of the piezoelectric substrate; a space portion formed in one of the piezoelectric substrate and the reinforcing substrate, an area of the space portion being larger than a region in which a Lamb wave is propagated; and a connecting surface formed in a periphery of the space portion.

4 Claims, 9 Drawing Sheets

OTHER PUBLICATIONS

Shigeo Kanna; (1999); "Analysis of Frequency and Temperature Characteristics of Surface Acoustic Waves by Using an Infinite Element Method"; Technical report of IEICE; pp. 37 to 42.

Uozumi, K. et al., "IDT-Generated Ultrasonic Lamb Waves in a Very Thin Membrane," IEEE 1985 Ultrasonics Symposium p. 212-215, XP009083285 (Oct. 18, 1986).

Yantchev, Ventsislav et al., "Design and Fabrication of Thin Film Lamb Wave Resonators Utilizing Longitudinal Wave and Interdigital Transducers," 2005 IEEE Ultrasonics Symposium, p. 1580-1583, XP-10899205 (Sep. 18, 2005).

Nakagawa, Yasuhiko et al., "Temperature Characteristics of the Substrate for Lamb Wave Type Elastic Wave Device," vol. J89-C, No. 1, p. 34-39, XP009083340 (2006). (Translation).

Y. Jin et al.; "Characteristics of a Quasi-SH (Shear Horizontal) Acoustic Wave in Z-X Lithium Niobate Plates"; *1994 Ultrasonics Symposium*; pp. 465-470.

A. Volatier et al.; "UHF/VHF Resonators Using Lamb Waves Co-Integrated with Bulk Acoustic Wave Resonators"; *2005 IEEE Ultrasonics Symposium*; pp. 902-905.

* cited by examiner

LAMB WAVE TYPE FREQUENCY DEVICE AND METHOD THEREOF

BACKGROUND

1. Technical Field

The present invention relates to a Lamb wave type high frequency device and a method thereof. In particular, it relates to a Lamb wave type high frequency device in which a piezoelectric substrate having an IDT electrode is connected with a reinforced substrate and a method of manufacturing it.

2. Related Art

As high frequency resonators, surface acoustic wave elements using a Rayleigh wave, a Leaky wave and an SH wave and Lamb wave elements using a bulk wave such as a Lamb wave are conventionally known.

For example, a Rayleigh wave type surface acoustic wave element is known. In the element, an IDT electrode is formed in the Z'-axis direction on the surface of a quartz substrate called as ST cut quartz.

Such element is disclosed in "Analysis of frequency and temperature characteristics of surface acoustic waves by using an infinite element method" written by Shigeo Kanna in pages 37 to 42 of the technical report of IEICE, US 99-20 (199-06), in Shingaku Giho.

Further, an SH wave type surface acoustic wave element is also known, (see JP-A-10-233645, page 3 to page 6, FIG. 1). This device propagates a transverse wave in which the propagation direction of a surface acoustic wave is shifted by 90 degrees from a STW cut quartz, namely a ST cut quartz.

Further, a Lamb wave element using a bulk wave (volume wave) propagating with repeating reflection at the upper and lower surface of a piezoelectric substrate instead of a surface acoustic wave is also known. The element is particularly used for higher frequency since its phase velocity is larger compared to that of the surface acoustic wave (see JP-A-2003-258596 and "A substrate for a Lamb wave type surface acoustic wave element" written by Yasuhiko Nakagawa, Masayuki Momose and Shouji Kakio in page 93 to 96 of the 33rd EM symposium 2004.)

Further, in a Lamb wave type high frequency resonator using the Lamb wave element, a Lamb wave is efficiently excited by using an AT cut quartz substrate as a piezoelectric substrate and setting the relationship between the thickness of the quartz substrate H and the wavelength of the Lamb wave $\lambda$ to be $0<2H/\lambda\leq10$.

In the above disclosures (patent documents and non patent documents), however, the thickness of the piezoelectric substrate is from several μm to several tens μm, thereby handling the substrate is difficult since it is easily broken. In particular, as shown in JP-A-2003-258596, the thickness of the piezoelectric substrate has to be several wavelengths in order to excite a Lamb wave, though a Lamb wave type high frequency device can realize higher frequency compared to a case using a surface acoustic wave. Hence, such device is hardly handled and easily broken compared to the surface acoustic device, further, its yield is lowered.

SUMMARY

An advantage of the present invention is to provide a Lamb wave type high frequency device realizing a stable resonance property and an enhanced structural strength and a method of manufacturing it with an improved yield in which the device is uneasily broken.

According to a first aspect of the invention, a Lamb wave type high frequency device includes: a piezoelectric substrate; an IDT electrode formed on a first main surface of the piezoelectric substrate; a reinforcing substrate connected to a second main surface of the piezoelectric substrate; a space portion formed on the piezoelectric substrate or the reinforcing substrate, an area of the space portion being larger than a region in which a Lamb wave is propagated; and a connecting surface formed in the periphery of the space portion.

In the above aspect, the reinforcing substrate is provided and connected to the piezoelectric substrate, which is thin and easily broken. The structure realizes a Lamb type high frequency device of which a structural strength is enhanced, uneasily broken but easily handled.

Further, in the aspect, there is the space portion formed in the piezoelectric substrate or the reinforcing substrate and having an area that is larger than a region in which a Lamb wave is propagated. The structure realizes a Lamb type high frequency device that excludes energy loss of a Lamb wave excitation at the connecting surface with maintaining a structural strength, resulting in the stable resonance property having high excitation efficiency.

Further, it is preferable that the space portion includes a boxlike recess formed in the piezoelectric substrate or the reinforcing substrate.

This structure easily forms the above space portion by connecting the piezoelectric substrate and the reinforcing substrate. The space portion includes the boxlike recess. Hence, all circumferential areas surrounding the recess (namely the space portion) are connected, making a Lamb type high frequency device have sufficient structural strength, even if the thickness of the piezoelectric substrate, which thickness is required as an exciting condition, is several μm.

Further, the recess is boxlike, making the space portion possible to be air-tightly sealed, namely as a vacuum. Hence, the structure excludes energy loss from the interface at the backside (another main surface) of a piezoelectric substrate that reflects a Lamb wave.

Further, it is preferable that the space portion includes a groove-like recess formed in the piezoelectric substrate or the reinforcing substrate.

The cross section of the groove-like recess is an almost square C shape in which opposed side surfaces of the piezoelectric substrate or the reinforcing substrate are opened, and two circumferential directions of the recess are reinforced. A sacrificed layer is formed in the recess and then the sacrificed layer is easily removed from the opening of the side surface after the IDT electrode is formed. Details are described later.

In addition, it is preferable that the piezoelectric substrate be a quartz substrate.

Using a quartz substrate as the piezoelectric substrate realizes a temperature characteristic that is superior to that of the conventional STW cut quartz substrate and ST cut quartz substrate.

According to a second aspect of the invention, a Lamb wave type high frequency device includes: a piezoelectric substrate; an IDT electrode formed on a first main surface of the piezoelectric substrate; a reinforcing substrate connected to a second main surface of the piezoelectric substrate; a space portion formed in the piezoelectric substrate or the reinforcing substrate, an area of the space portion being larger than a region in which a Lamb wave is propagated; a connecting surface formed in a periphery of the space portion; and a package having a case and a lid and air-tightly housing the piezoelectric substrate and the reinforcing substrate.

In this aspect, the piezoelectric substrate reinforced by the reinforcing substrate is encapsulated by the package, protecting the piezoelectric substrate from the outer environments.

Further, exciting characteristics are remarkably deteriorated when the IDT electrode is hurt. But the above structure protects the IDT electrode after packaging since the IDT is free from contact within the package.

Further, the package is air-tightly sealed, maintaining inside the package as a vacuum and restraining energy loss at the IDT electrode. Further, the space portion can be maintained as a vacuum by vacuuming the package at only one time, even if the space portion is a groove-like recess having an opening at the side surface.

Further, it is preferable that the connecting electrode formed within the case be connected with a plurality of pads formed at least on a bus bar included in the IDT electrode.

Providing the pads on the bus bar does not affect the excitation. Hence, the pads provided on the bus bar can electrically connect the connecting electrode and fix the piezoelectric substrate and the reinforcing substrate to the package.

The connection using the pad is called as a flip chip mounting. Using the flip chip mounting realizes both fixing and connection simultaneously, downsizing the thickness and the area for mounting, and making the device a low height and miniaturized compared to the wire bonding conventionally used to mount surface acoustic wave elements.

A third aspect of the invention is a method for manufacturing the Lamb wave type high frequency device having the first aspect. Namely the device includes: a piezoelectric substrate; an IDT electrode formed on a first main surface of the piezoelectric substrate; a reinforcing substrate connected to a second main surface of the piezoelectric substrate; a space portion formed in the piezoelectric substrate or the reinforcing substrate, an area of the space portion being larger than a region in which a Lamb wave is propagated; and a connecting surface formed in a periphery of the space portion. The method comprises: forming a groove-like recess corresponding to the space portion provided in either a thick plate of the piezoelectric substrate or the reinforcing substrate; forming a sacrificed layer in the recess; connecting the thick plate of the piezoelectric substrate with the reinforcing substrate; polishing the thick plate of the piezoelectric substrate to a given thickness after the connection; and forming the IDT electrode and removing the sacrificed layer after the polishing.

In the third aspect, the piezoelectric substrate is connected to the reinforcing substrate as the thick plate after the sacrificed layer is formed in the recess, and the substrate is polished to a given thickness. Further, the sacrificed layer is removed after the IDT electrode is formed so as to form the above mentioned space portion. Hence, the sacrificed layer is maintained until just before the Lamb wave type high frequency device is completed. This process can reduce the break of the piezoelectric substrate, improving the yield of it.

Further, forming the groove-like recess easily removes the sacrificed layer from the opening of the both ends of the groove.

A fourth aspect of the invention is a method for manufacturing the Lamb wave type high frequency device having the first aspect. Namely, the device includes: a piezoelectric substrate; an IDT electrode formed on a first main surface of the piezoelectric substrate; a reinforcing substrate connected to a second main surface of the piezoelectric substrate; a space portion formed in the piezoelectric substrate or the reinforcing substrate, an area of the space portion being larger than a region in which a Lamb wave is propagated; and a connecting surface formed in a periphery of the space portion. The method comprises: forming a boxlike recess corresponding to the space portion in the reinforcing substrate; forming a penetration hole in the bottom of the recess; forming a sacrificed layer in the recess; connecting a thick plate of the piezoelectric substrate with the reinforcing substrate; polishing the thick plate of the piezoelectric substrate to a given thickness after the connection; and forming the IDT electrode and removing the sacrificed layer after the polishing.

In these processes, forming the penetration hole connected to the recess can remove the sacrificed layer using the penetration hole even if the recess potion is boxlike and the sacrificed layer is formed within the recess.

It is preferable that the piezoelectric substrate be made of a quartz substrate and the scarified layer be made of a material etched by an etchant, which is different from another etchant etching the piezoelectric substrate.

Here, the above material etched by an etchant means a material such as zinc oxide (ZnO) and aluminum nitride (AlN). The sacrificed layer made of one of such materials is resolved by the etchant when the layer is removed with etching, but the piezoelectric substrate is not resolved by it.

In this process, the interface between sacrificed layer and the piezoelectric substrate is not etched by the etchant when the sacrificed layer is removed, attaining superior resonance characteristics when a Lamb wave is reflected at the both front and back surfaces of the piezoelectric substrate.

Further, it is preferable that the above fourth aspect of the invention further comprise; forming the sacrificed layer with $SiO_2$, forming a protection layer against etching on the second main surface of the piezoelectric substrate made of a quartz substrate, and removing the protection layer in the range which is lager than an area of the Lamb wave propagated after removing the sacrificed layer.

The structural body composed of the piezoelectric substrate and the reinforcing substrate as an oscillating body is called as micro electro mechanical systems (MEMS). In MEMS, it is well known that the sacrificed aver is made of $SiO_2$. The etchant for the quartz substrate, however, is the same for $SiO_2$ of the sacrificed layer, etching other main surface (the back surface) contacted with the sacrificed layer of the quartz substrate in the process of removing the sacrificed layer. The Lamb wave type high frequency device uses a bulk wave, making the back surface of the device affect the oscillation characteristics. Hence, the protection layer against etching at the back surface of the quartz substrate protects the quartz substrate from an etchant.

A fifth aspect of the invention is a method for manufacturing the Lamb wave type high frequency device having the first aspect. Namely, the device includes: a piezoelectric substrate; an IDT electrode formed on a first main surface of the piezoelectric substrate; a reinforcing substrate connected to a second main surface of the piezoelectric substrate; a space portion formed in the piezoelectric substrate or the reinforcing substrate, an area of the space portion being larger than a region in which a Lamb wave is propagated; and a connecting surface formed in a periphery of the space portion. The method comprises: forming a recess corresponding to the space portion provided in either a thick plate of the piezoelectric substrate or the reinforcing substrate, connecting the thick plate of the piezoelectric substrate with the reinforcing substrate; filling a thermosetting resin in the space portion to be a sacrificed layer and curing the thermosetting resin after the connecting; polishing the thick plate of the piezoelectric substrate to a given thickness after the curing; and forming the IDT electrode and removing the sacrificed layer after the polishing.

Using a thermosetting resin to be the sacrificed layer can fill the resin in the space portion after connecting the thick plate of the piezoelectric substrate with the reinforcing substrate. This process does not need expensive manufacturing facilities such as deposition apparatuses, chemical vapor deposition (CVD) apparatuses and the like.

BRIEF DESCRIPTION OF THE DRAWINGS

The invention will be described with reference to the accompanying drawings, wherein like numbers reference like elements.

FIGS. 14A and 14B show a sixth manufacturing method of the invention.

DESCRIPTION OF EXEMPLARY EMBODIMENTS

Embodiments of the invention will be described with reference to the accompanying drawings.

Figure 1:
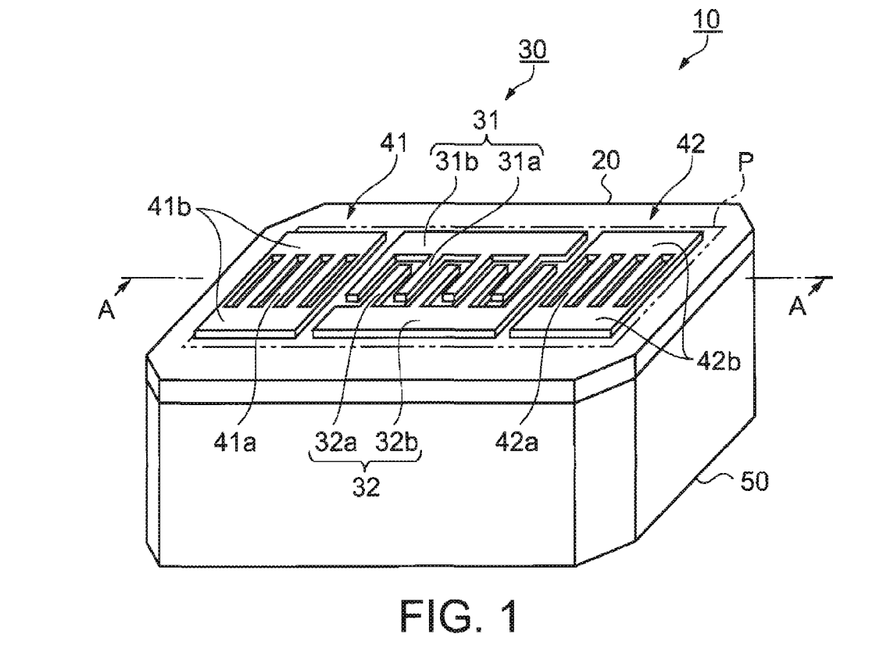
FIG. 1 is a perspective view of a Lamb wave type high frequency device of a first embodiment of the invention.
Figure 2:
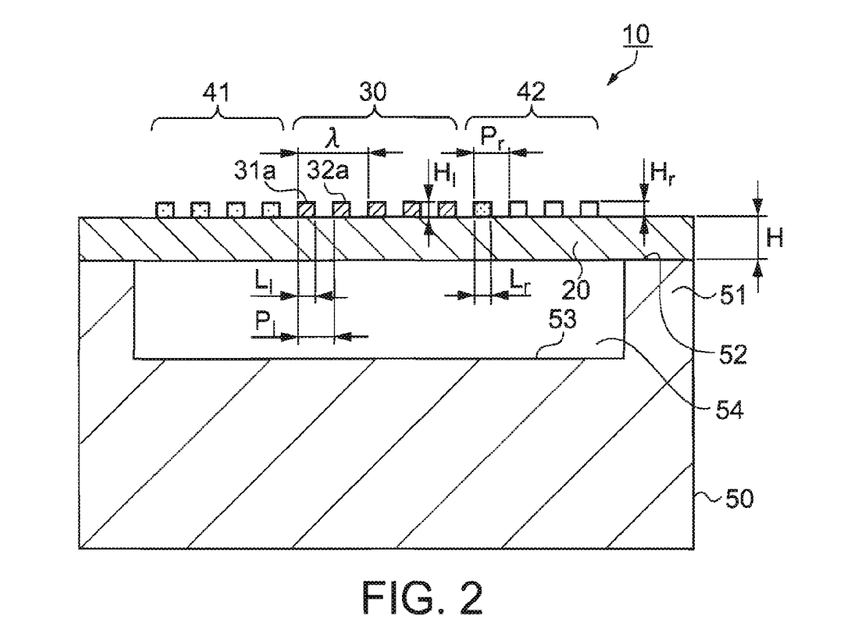
FIG. 2 is a sectional view showing A-A cut surface in FIG. 1.
Figure 3:
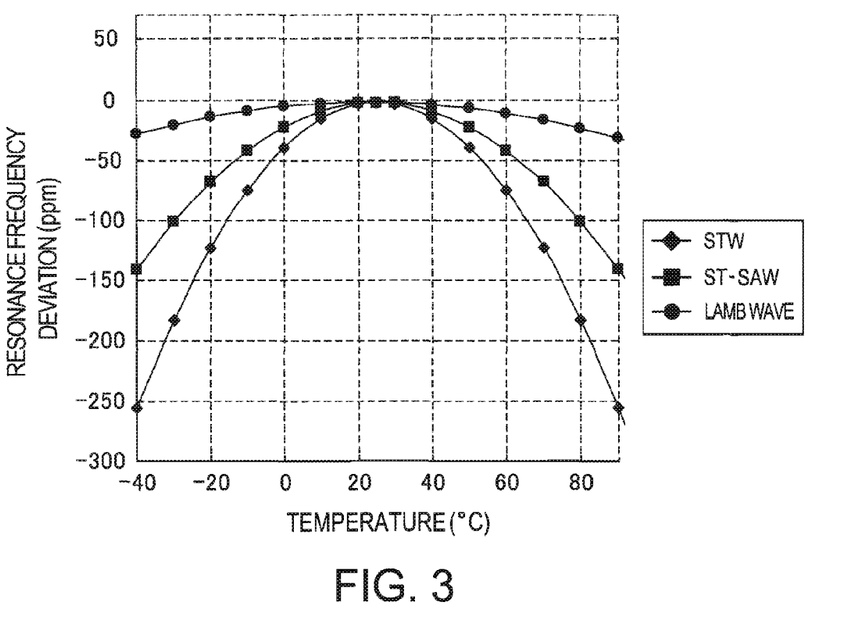
FIG. 3 is a graph showing a frequency temperature characteristic of the Lamb wave type high frequency device of the first embodiment of the invention.
Figure 4:
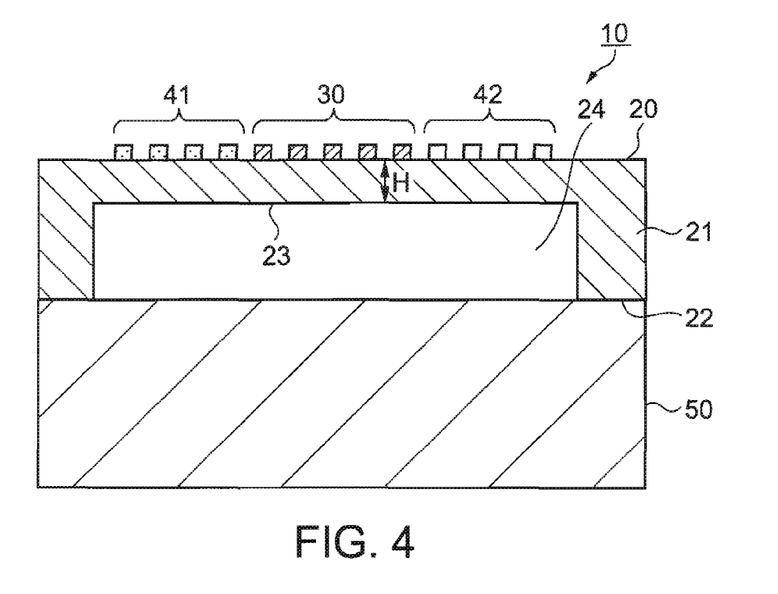
FIG. 4 is a sectional view schematically showing a Lamb wave type high frequency device of a second embodiment of the invention.
Figure 5:
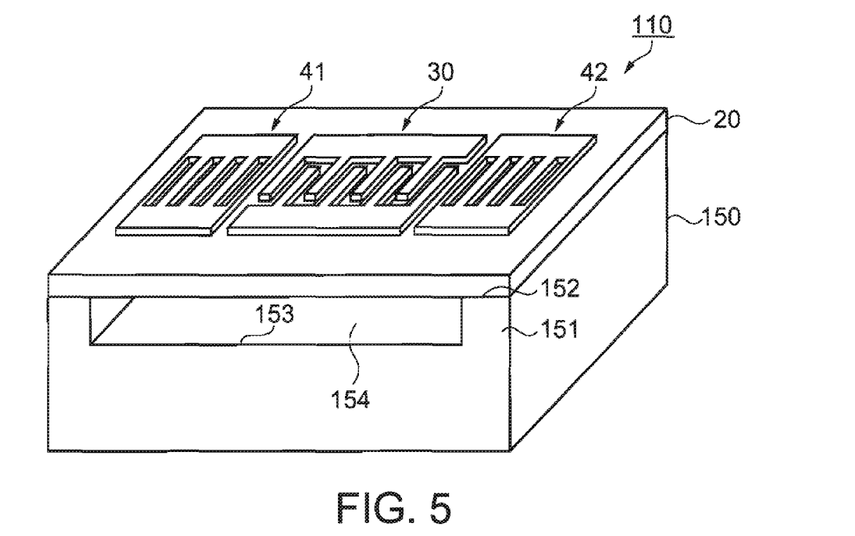
FIG. 5 is a perspective view schematically showing a Lamb wave type high frequency device of a third embodiment of the invention.
Figure 6:
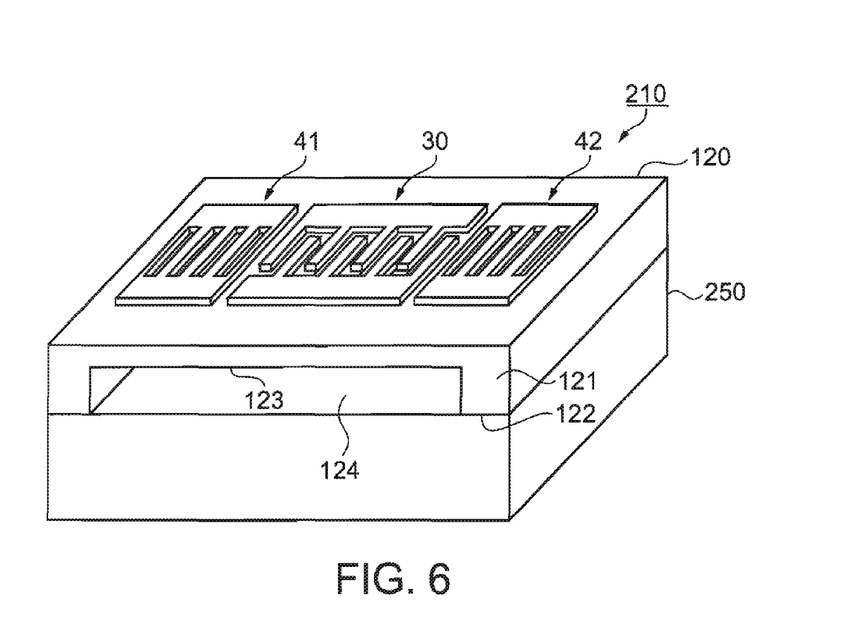
FIG. 6 is a perspective view schematically showing a Lamb wave type high frequency device of a fourth embodiment of the invention.
Figure 7:
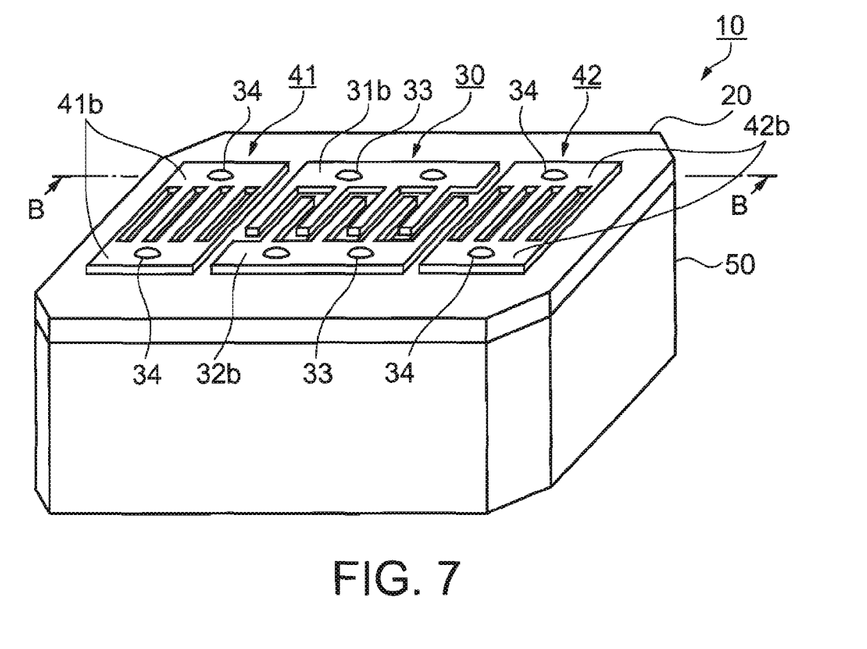
FIG. 7 is a perspective view schematically showing a Lamb wave type high frequency device of a fifth embodiment of the invention.
Figure 8:
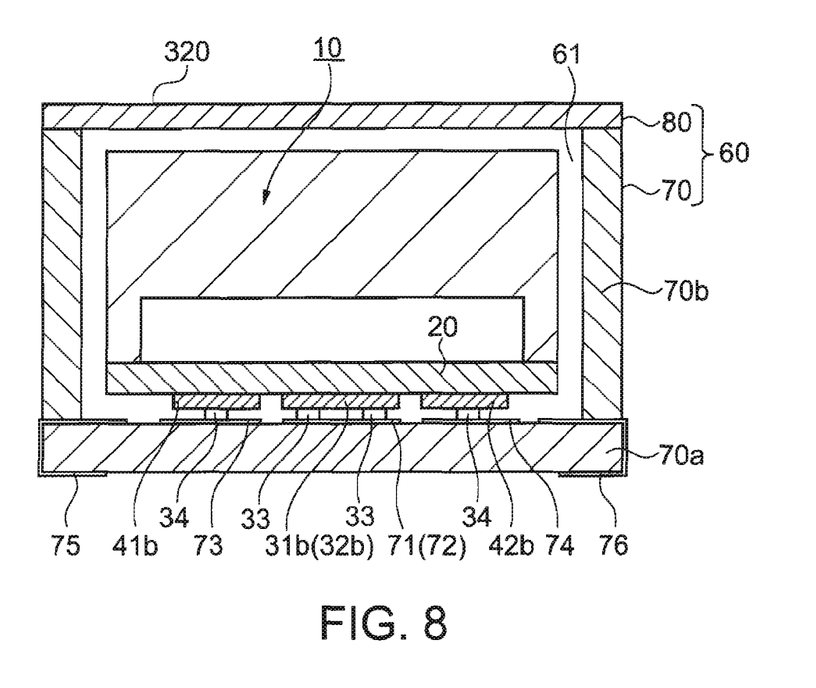
FIG. 8 is a sectional view schematically showing a Lamb wave type high frequency device of the fifth embodiment of the invention, which is housed in a package.

FIG. 1 to FIG. 3 show a Lamb wave type high frequency device according to a first embodiment of the invention. FIG. 4, FIG. 5 and FIG. 6 show the devices according to a second, third and fourth embodiments of the invention, respectively. FIG. 7 and FIG. 8 show the device according to a fifth embodiment of the invention. FIG. 9A to FIG. 11B show methods of manufacturing a Lamb wave type high frequency device of the invention.

First Embodiment

FIGS. 1 and 2 show a Lamb wave type high frequency device according to the first embodiment of the invention. FIG. 1 is a perspective view thereof and FIG. 2 is a sectional view schematically showing the A-A cut surface in FIG. 1. In FIG. 1, a Lamb wave type high frequency device 10 comprises a piezoelectric substrate 20 and a reinforcing substrate 50 that are connected each other.

The piezoelectric substrate 20 is a thin substrate made of quartz and has a uniform thickness. The substrate 20 comprises an IDT electrode 30, which is made of aluminum and has a comb-teeth shaped, on one main surface of it and a pair of reflectors 41 and 42 in the both sides of propagating direction of a Lamb wave from the IDT electrode 30. The IDT electrode 30 comprises an IN/OUT electrode 31 and a GND electrode 32. The IN/OUT electrode 31 is provided with a plurality of electrode fingers 31a and a bus bar 31b connecting the fingers 31a each other. The GND electrode 32 is provided with a plurality of electrode fingers 32a and a bus bar 32b connecting the fingers 32a each other. Then, the electrode fingers 31a and 32a are interdigitated to form cross finger electrodes.

The reflectors 41 and 42 are provided with electrode fingers 41a and 42a that are arranged in a lattice, the bus bar 41b connecting the both ends of the electrode fingers 41a and the bus bar 42b connecting the both ends of the electrode fingers 42a.

The Lamb wave type high frequency device 10 having the IDT electrode 30 is called as a one-port resonator.

FIG. 2 shows the relationship among the IDT electrode 30, the reflectors 41 and 42 and the reinforcing substrate 50. FIG. 1 also shows such relationship. In FIG. 2, the pitch between electrode fingers 31a and 32a is PT, the line width of electrode fingers 31a and 32a is $L_T$, pitches of IN/OUT electrode 31 and GND electrode 32 are λ, the wavelength of a Lamb wave, and the thickness of electrodes is $H_T$. Here, λ, the wavelength of a Lamb wave, is a twice of the pitch $P_T$.

Further, the pitch of electrode fingers 42a of the reflector 42 is $P_r$, the line width is $L_r$, and the thickness is $H_r$.

In the Lamb wave type high frequency device, it is known that a Lamb wave is efficiently excited by setting the relationship between the thickness of H of a piezoelectric substrate 20 and λ, the wavelength of a Lamb wave, within the range of 0<2H/λ≦10, which is disclosed in JP-A-2003-258596. As a result, the thickness of the piezoelectric substrate 20 is several μm to several tens μm.

The back surface of the piezoelectric substrate 20 is connected to the reinforcing substrate 50. The back surface is the other main surface opposite to one main surface on which the IDT electrode 30 and the reflectors 41 and 42 are formed. The reinforcing substrate 50, a platy substrate made of Si, has a boxlike recess 53 formed in the center. Hence, the reinforcing substrate 50 comprises the recess 53 in the center and a rim portion 51 provided around all circumferences of the recess 53.

The piezoelectric substrate 20 is connected to a connecting surface 52, which is an upper surface of the rim portion 51 of the reinforcing substrate 50, by connecting means such as chemical bonding or adhesives, and includes a space portion

54. This space portion 54 has a vacuumed state. Here, as shown in FIG. 1, the connecting surface 52 contacts the space portion 54 at an inner circumference surface P, which is far from the IDT 30 and the reflectors 41 and 42. That is, the space portion 54 forms an area wider than a region in which a Lamb wave is propagated. Therefore, propagating a Lamb wave is not affected at all by the connection.

Further, the piezoelectric substrate 20 is reinforced since all circumferences thereof are connected to the rim portion 51 of the reinforcing substrate 50.

An input drive signal having a given frequency is input to the IDT electrode 30 so that the Lamb wave type high frequency device 10 constituting the above components excites a Lamb wave. Then, the Lamb wave is propagated to the direction of the reflectors 41 and 42 with being reflected on the back and front surfaces of the piezoelectric substrate 20. Then, the wave is reflected by the reflectors 41 and 42.

Next, a frequency temperature characteristic of the Lamb wave type high frequency device 10 according to the embodiment is explained.

FIG. 3 is a graph showing a frequency temperature characteristic of the Lamb wave type high frequency device 10. The vertical axis shows the resonance frequency deviation (ppm) while the horizontal axis shows temperature (° C.). As shown in FIG. 3, the frequency temperature characteristic of the Lamb wave type high frequency device 10 using a quartz substrate as the piezoelectric substrate 20 is superior to that of devices using an STW cut quartz substrate and an ST cut quartz substrate (ST-SAW).

Hence, according to the first embodiment, all circumferential areas of the recess 53 (the space portion 54) are connected to the reinforcing substrate 50, enhancing the structural strength, and holding the Lamb wave type high frequency device 10 that is uneasily broken and, easily handled, even if the thickness of the piezoelectric substrate 20 is several μm, which thickness is required as the exciting condition.

Further, the space portion 54, which has an area that is larger than a region in which a Lamb wave is propagated, is provided between the piezoelectric substrate 20 and the reinforcing substrate 50, and the space portion 54 is vacuumed. The structure realizes the Lamb wave type high frequency device 10 that excludes energy loss of Lamb wave excitation at the back surface of the piezoelectric substrate in a manner maintaining a structural strength, resulting in the stable resonance property having high excitation efficiency.

Further, using a quartz substrate as the piezoelectric substrate realizes a temperature frequency characteristic that is superior to that of the STW cut quartz substrate and ST cut quartz substrate (ST-SAW).

Second Embodiment

The second embodiment of the invention is explained with reference to a figure. In the second embodiment, the recess is provided in the piezoelectric substrate, though it is provided in the reinforcing substrate in the first embodiment shown in FIG. 2. The major difference from the first embodiment is explained.

FIG. 4 is a sectional view schematically showing the Lamb wave type high frequency device 10 of the second embodiment. In FIG. 4, the IDT electrode 30 and the reflectors 41 and 42 are formed on the one surface (the front surface) of the piezoelectric substrate 20 and a boxlike recess 23 is provided to the other surface (the back surface) of it.

The thickness H at the bottom of the recess 23 is set to the following relationship regarding the wavelength λ of the Lamb wave: $0 < 2H/\lambda \leq 10$. A rim portion 21 is formed at the circumferential area of the recess 23 and a connecting surface 22 of the upper surface (the lower surface in the figure) of the edge portion 21 is bonded to the reinforcing substrate 50 with chemical bonding or an adhesive, forming a space portion 24. The reinforcing substrate 50 is a thick substrate made of Si.

Hence, according to the second embodiment, the structural strength of the piezoelectric substrate 20 is enhanced due to the rim portion 21 bonded with the reinforcing substrate 50 as a reinforcing portion. The space portion 24 has a vacuumed state. Therefore, the second embodiment has the same efficiency of the first embodiment.

Third Embodiment

The third embodiment of the invention is explained with reference to a figure. In the third embodiment, the groove-like recess is provided in the reinforcing substrate, though the boxlike recess is provided in the reinforcing substrate in the first embodiment shown in FIG. 2. The major difference from the first embodiment is explained.

FIG. 5 is a sectional view schematically showing a Lamb wave type high frequency device 110 of the third embodiment.

In a reinforcing substrate 150, a groove-like recess 153 (an almost square C shape from the front view) is formed. The recess 153 is formed as crossing the reinforcing substrate 150, making the side surface of the width direction opened and a rim portion 151 is formed at both ends of the reinforcing substrate 150 in the longitudinal direction. Then, the piezoelectric substrate 20 is bonded to the reinforcing substrate 150 at a connecting surface 152 of the upper surface of the rim portion 151 by connecting means such as chemical bonding or an adhesive, forming a space portion 154. The piezoelectric substrate 20 has the same structure of the piezoelectric substrate in the first embodiment shown in FIG. 2.

Here, the direction of forming the recess 153 is not limited as long as the recess 153 has an area, which includes a region far from the IDT electrode 30 and the reflectors 41 and 42, namely, which area is wider than a region of a Lamb wave propagated.

Fourth Embodiment

The fourth embodiment of the invention is explained with reference to a figure. In the fourth embodiment, the groove-like recess is provided in the piezoelectric substrate, though the boxlike recess is provided in the piezoelectric substrate in order to form a space portion in the second embodiment shown in FIG. 4. The major difference from the second embodiment is explained.

FIG. 6 is a sectional view schematically showing a Lamb wave type high frequency device 210 of the fourth embodiment. In a piezoelectric substrate 120, a groove-like recess 123 (an almost square C shape from the front view) is formed. The recess 123 is formed as crossing the piezoelectric substrate 120, making the side surface of the width direction opened and a rim portion 121 is formed at both ends of the piezoelectric substrate 120 in the longitudinal direction. Then, the piezoelectric substrate 120 is bonded to a reinforcing substrate 250 at a connecting surface 122 of the upper surface (the lower surface in the figure) of the rim portion 121 by connecting means such as chemical bonding or an adhesive, forming a space portion 124. The reinforcing substrate 250 has the same structure of the reinforcing substrate in the second embodiment shown in FIG. 4.

Here, the direction of forming the recess 123 is not limited as long as the recess 123 has an area, which includes the region far from the IDT electrode 30 and the reflectors 41 and 42, namely, which area is wider than a region of a Lamb wave propagated.

According to the third and fourth embodiments, the structural strength of the piezoelectric substrate 120 is enhanced in the similar manner of the first and second embodiments, though the recess 153 is formed in the reinforcing substrate 150 and the recess 123 is formed in the piezoelectric substrate 120.

The front views of the recesses 123 and 153 are an almost square C shape in which pairs of opposed side surfaces of the piezoelectric substrate 120 and the reinforcing substrate 150 are opened. A sacrificed layer is formed in the recesses 123 and 153, and then the sacrificed layer is easily removed from the opening of the side surface after the IDT electrode is formed. Details are described later.

Fifth Embodiment

The fifth embodiment of the invention is explained with reference to a figure. In the fifth embodiment, any of the Lamb wave type high frequency devices 10, 110 and 210 shown in the first to fourth embodiments are encapsulated in a package. Here, the Lamb wave type high frequency device 10 shown in the first embodiment is exemplified. The same reference numerals are applied to the same structures.

FIG. 7 is a sectional view schematically showing the Lamb wave type high frequency device 10 of the fifth embodiment. In FIG. 7, there are a plurality of pads on the upper surfaces of bus bars 31b, 32b, 41b and 42b of the IDT electrode 30 and the reflectors 41 and 42 formed on the surface of the piezoelectric substrate 20.

More specifically, each two pads 33, totally four pads, are provided on the bus bar 31b, and the bus bar 32b of the IDT electrode 30 respectively. Further, each two pads 33, totally four pads, are provided on the bus bar 41b, and the bus bar 42b of the reflectors 41 and 42 respectively. These pads 33 and 34 are made of metal such as Au and solder, or conductive adhesives, and have an approximately half spherical shape that is the same size.

As shown in FIG. 7, these pads 33 and 34 are arranged in a well-balanced manner in a plan view in order that the Lamb wave type high frequency device 10 is housed in a package 60 shown in FIG. 8 and bonded. Hence, the allocation and the number of pads 33 and 34 are not limited.

The Lamb wave type high frequency device 10 including the pads 33 and 34 is encapsulated in the package 60.

FIG. 8 is a cross section schematically showing the state in which the Lamb wave type high frequency device 10 is encapsulated in the package 60 and B-B cut section in FIG. 7. FIG. 7 is used as a reference. In FIG. 8, the package 60 comprises a case 70 and a lid 80. The case 70 and the lid 80 are made of ceramics in the embodiment.

The case 70 includes a base 70a and a rim portion 70b, which are laminated. Connecting electrodes 71 and 72, which are formed inside of the base 70a, are extended at the connecting area of the base 70a and the rim portion 70b. These electrodes are connected to the outer connecting terminals 75 and 76 that are provided on the back surface of the base 70a (connection is not shown in the figure).

The Lamb wave type high frequency device 10 is fixed so that the piezoelectric substrate 20 faces toward the base 70a. The pads 33 provided in the bus bar 31b are placed at the connecting electrode 71, the pads 33 provided in the bus bar 32b are placed at the connecting electrode 72, and the pads 34 provided in the bus bars 41a and 42b are placed at the electrode lands 73 and 74. These pads are instantaneously bonded by heating and adding pressure, for example. This bonding is called flip chip mounting.

Hence, the IN/OUT electrode 31 shown in FIG. 1 is connected to the outer connecting terminal 75 and the GND electrode 32 shown in FIG. 1 is connected to the outer connecting terminal 76, making it possible to receive a given excited drive signal from outside.

Further, the reflectors 41 and 42 are electrically independent from the IDT electrode 30. The electrode lands 73 and 74 are provided so that the Lamb wave type high frequency device 10 is hold with well balanced and fixed to the base 70a with highly contact strength.

After the Lamb wave type high frequency device 10 is encapsulated into the case 70, a lid 320 is bonded to the rim portion 70b by connecting means such as chemical bonding or an adhesive. In this case, a space portion 61 within the package 60 is in a vacuum state.

In the embodiment, the Lamb wave type high frequency device 10 according to the first embodiment is encapsulated into the package 60. But, it is possible to encapsulate Lamb wave type high frequency devices according to the second embodiment to fourth embodiment into the package 60 in a similar manner.

In the first and second embodiments, the space portions 54 and 24 are in vacuum states and the space portion 61 is also vacuumed within the package 60. Namely, all areas for exciting a Lamb wave are in a vacuum state.

Further, in the third and fourth embodiments, in case of packaging, when the space portion 61 is in a vacuum state, the space portion 154 and the space portion 124 of which a part is opened can be simultaneously in a vacuum state.

Hence, according to the fifth embodiment, the Lamb wave type high frequency device 10 reinforced by the reinforcing substrate 50 is encapsulated by the package 60, protecting the device 10 from the outer environments.

Further, it is well known that excitation property is remarkably deteriorated when the IDT electrode 30 is hurt or attached with water or dust. However, in the above embodiments, it is encapsulated in the package 60 and held in a vacuum state protecting the IDT electrode 30 and maintaining good resonance property.

Further, the inside of the package is in a vacuum state, restraining energy loss at the IDT electrode 30.

Further, the pads 33 and 34 are provided on the bus bars 31b, 32b, 41b, and 42b that do not affect excitation, and connected to the connecting electrodes 71 and 72 and the electrode lands 73 and 74. This structure electrically connects the connecting electrode 71 to the pads 33 and connecting electrode 72 to the pads 34, and surely fixes the Lamb wave type high frequency device 10 to the base 70a of the package 60.

Using the flip chip mounting realizes both fixing and connecting the device simultaneously, downsizing the thickness and the area for mounting, and making the device a low height and miniaturized compared to wire bonding conventionally used for mounting surface acoustic wave elements.

First Manufacturing Method

Next, a method for manufacturing a Lamb wave type high frequency device of the invention is explained with reference to the drawings.

FIGS. 9A to 9F are sectional views schematically showing main processes of manufacturing a Lamb wave type high frequency device in the invention. In FIGS. 9A to 9F, the Lamb wave type high frequency device 110 in the third embodiment shown in FIG. 5 is exemplified. The device 110 has the groove-like recess 153 in the reinforcing substrate 150.

Figure 9A:
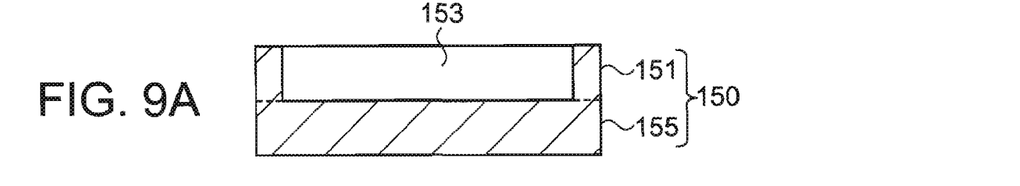
FIGS. 9A to 9F are sectional views schematically showing main processes of manufacturing a Lamb wave type high frequency device, according to a first method thereof in the invention.

First, the groove-like recess 153 is formed on the reinforcing substrate 150, which is made of a silicon plate. As a method of forming the recess 153, there are two methods such as removing a portion corresponding to the recess 153 by etching, and depositing the rim portion 151 at the both opposite ends of a plate base 155. Further, a grinding process is also selected as the above method since the recess is like a groove.

Figure 9B:
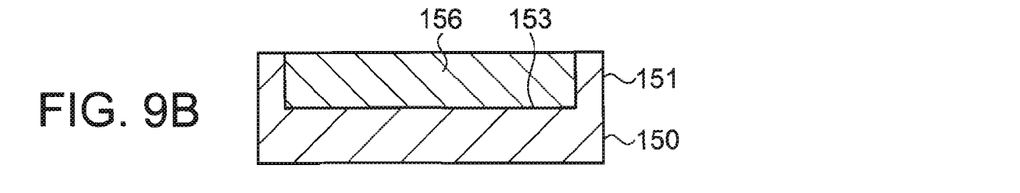

Next, as shown in FIG. 9B, a sacrificed layer 156 made of zinc oxide (ZnO) is formed within the recess 153 by CVD or the like, and the upper surface of the sacrificed layer 156 and the rim portion 151 are smoothed by CMP and the like.

As the sacrificed layer 156, a metal such as aluminum nitride (AlN), Al, Cu, Cr and Ag is used instead of zinc oxide. These materials for a sacrificed layer are etched by an etchant, which is different from the one used for the piezoelectric substrate made of quartz. Namely, a material should be selected that the etchant for the material does not resolve the back surface of the piezoelectric substrate, when the sacrificed layer is etched and removed.

Figure 9C:
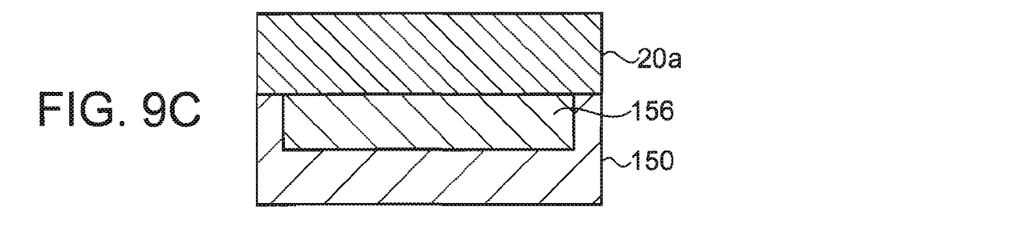

Further, as shown in FIG. 9C, a thick plate 20a is connected to the reinforcing substrate 150 by connecting means such as chemical bonding or an adhesive. Here, the thick plate 20a is a quartz substrate that is a material for forming a piezoelectric substrate, while the sacrificed layer 156 is formed in the reinforcing substrate 150. Here, the thickness of the thick plate 20a is 100 μm.

Figure 9D:
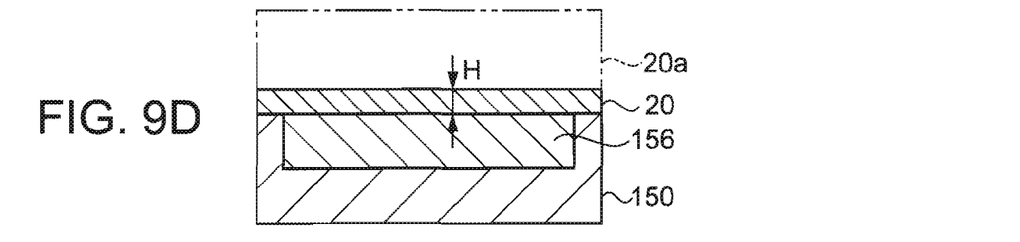

Next, as shown in FIG. 9D, the piezoelectric substrate 20 having a predetermined thickness is formed by polishing the thick plate 20a under the state where the thick plate 20a is connected to the reinforcing substrate 150. The thickness H of the piezoelectric substrate 20 is set to the following range related to the wavelength λ of the Lamb wave: $0<2H/\lambda \leqq 10$. Specifically, it is several μm.

Figure 9E:
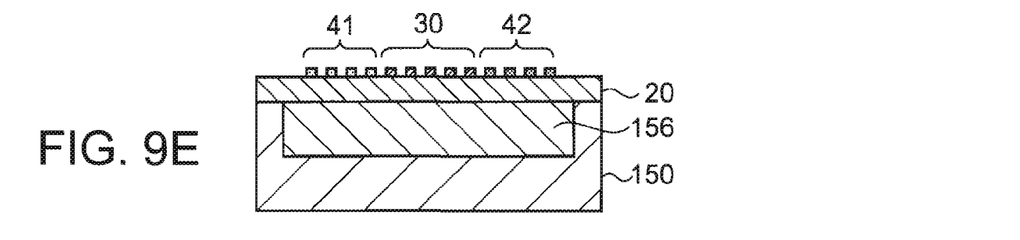

Next, the IDT electrode 30 and the reflectors 41 and 42 are formed on the surface of the piezoelectric substrate 20 by photolithography as shown in FIG. 9E.

Figure 9F:
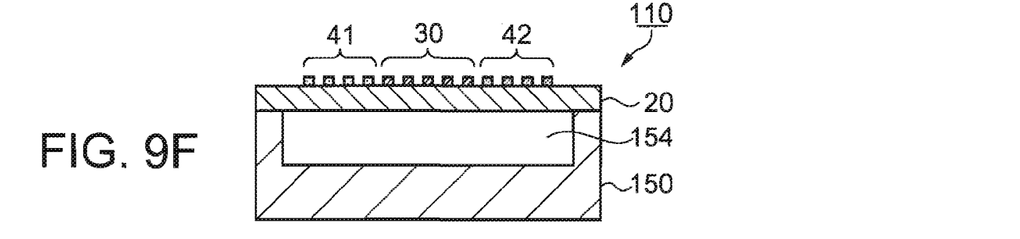

Then, as shown in FIG. 9F, the sacrificed layer 156 is removed by release etching so as to form the space portion 154.

Here, the IDT electrode 30 and the reflectors 41 and 42 may be formed after release etching.

The pads 33 and 34 shown in FIG. 7 can be formed directly after the IDT electrode 30 and the reflectors 41 and 42 are formed.

Second Manufacturing Method

Figure 10A:
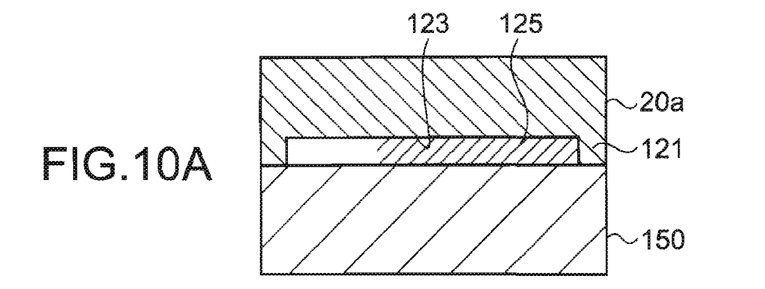
FIGS. 10A and 10B are sectional views schematically showing a part process of manufacturing a Lamb wave type high frequency device of the fourth embodiment, according to a second method thereof in the invention.

Next, a second method for manufacturing the Lamb type high frequency device 210 in the fourth embodiment shown in FIG. 6 will be explained referring to FIGS. 10A and 10B. The major difference from the above method is explained.

First, the groove-like recess 123 is formed in the thick plate 20a of a quartz substrate by etching or the like and the sacrificed layer 126 made of zinc oxide is formed within the recess 123 by CVD or the like. Then, the upper surfaces of the sacrificed layer 125 and the rim portion 121 are smoothed by CMP or the like.

Then, the substrate 20 is bonded to the reinforcing substrate 150 by connecting means such as chemical bonding or an adhesive. FIG. 10A shows how to be bonded.

Figure 10B:
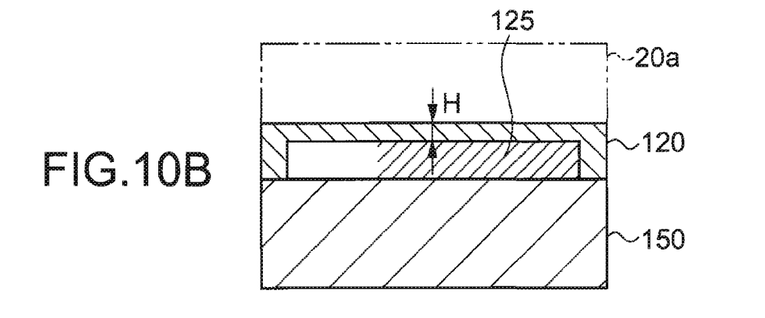

Next, as shown in FIG. 10B, the piezoelectric substrate 120 having a predetermined thickness is formed by polishing the thick plate 20a. The thickness H of the piezoelectric substrate 120 is set to the following range related to the wavelength λ of the Lamb wave: $0<2H/\lambda \leqq 10$. Specifically, it is several μm.

Forming the IDT electrode 30 and the reflectors 412 and 42 and removing the sacrificed layer 125 are the same manners and processes as already described and shown in FIGS. 9E and 9F. Details are omitted.

According to the method for manufacturing a Lamb wave type high frequency device, as shown in FIGS. 9A to 9F, the sacrificed layer 156 is formed in the recess 153 of the reinforcing substrate 150 and the piezoelectric substrate is bonded as it is thick, and polished to a predetermined thickness. Otherwise, as shown in FIGS. 10A and 10B, the recess 123 and the sacrificed layer 125 are formed under the state when the piezoelectric substrate is a thick plate 20a, then after the substrate 20a is bonded to the reinforcing substrate 150, the substrate 20 is polished to a predetermined thickness. The sacrificed layers 156 and 125 are removed to form the space portions 154 and 124 thereafter.

Hence, the sacrificed layers 156 and 125 are maintained until just before the Lamb wave type high frequency device is completed. This process can reduce the break of the piezoelectric substrate in manufacturing processes, improving the yield of it.

Further, forming the recesses 153 and 123 like a groove easily removes the sacrificed layers 156 and 125 from the opening of the both ends of the groove.

Third Manufacturing Method

A method for manufacturing the Lamb wave type high frequency device explained in the first embodiment is explained with reference to the drawings.

Figure 11A:
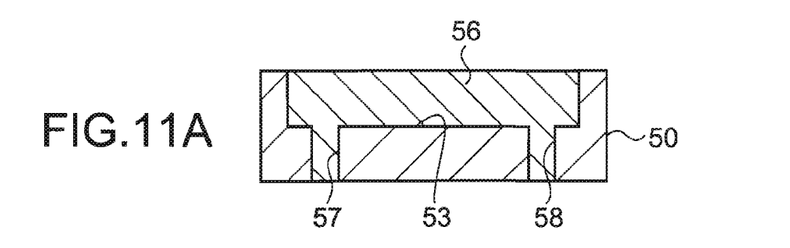
FIGS. 11A and 11B are sectional views schematically showing a part process of manufacturing a Lamb wave type high frequency device of the first embodiment, according to a third method thereof in the invention.
Figure 11B:
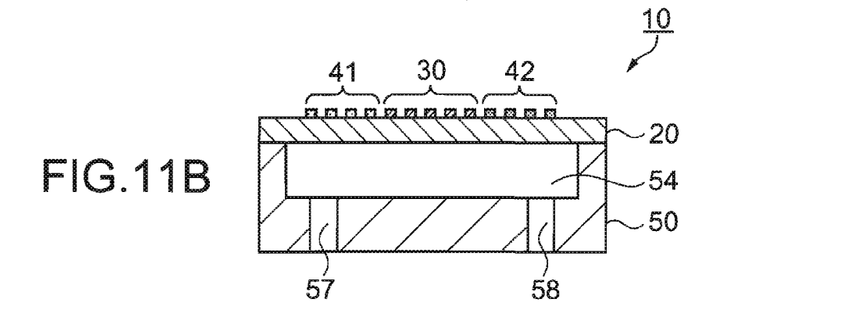

FIGS. 11A and 11B are sectional views schematically showing a part process of manufacturing the Lamb wave type high frequency device 10 of the first embodiment shown in FIGS. 1 and 2, according to a third method thereof in the invention. The Lamb wave type high frequency device 10 has the boxlike recess 53 in the reinforcing substrate 50, and there is no opened area at the state when the piezoelectric substrate 20 (the thick plate 20a) is bonded to the reinforcing substrate 50. Hence, the manufacturing method shown in FIGS. 9A to 9F cannot remove the sacrificed layer 56. The third method includes forming a penetration hole connecting the recess 53 to the bottom of the reinforcing substrate 50 in the reinforcing substrate 50.

First, the penetration holes 57 and 58 connecting the recess 53 to the bottom of the reinforcing substrate 50 are formed in the reinforcing substrate 50. Then the sacrificed layer 56 at least filling the recess 53 is formed as shown in FIG. 11A. Then, the surface of the reinforcing substrate 50 including the sacrificed layer 56 is smoothed by polishing and bonded to the thick plate 20a of the piezoelectric substrate. The following processes are the same shown in FIGS. 9C to 9F to complete the Lamb wave type high frequency device 10 shown in FIG. 11B.

Here, removing the sacrificed layer 56 uses the penetration holes 57 and 58 provided in the reinforcing substrate 50. After removing the sacrificed layer 56, the space portion 54 is communicated with the penetration holes 57 and 58 (not shown).

In FIGS. 11A and 11B, two penetration holes 57 and 58 are provided. But, the number of holes is not limited to two. Further, the shape of a penetration hole is not limited, including a circle and a square.

Accordingly, the Lamb wave type high frequency device 10 can be encapsulated into the package 60 described in the fifth embodiment shown in FIG. 8 and the space portion 54 is maintained in vacuum.

The Lamb wave type high frequency device 10 described in the second embodiment can also be formed by the above method. The Lamb wave type high frequency device 10 shown in FIG. 4 has the boxlike recess 23 in the piezoelectric substrate 20 and there is no opened area at the state when the piezoelectric substrate 20 (the thick plate 20a) is bonded. Here, not shown in the figure, it is possible to manufacture the device by providing a penetration hole communicating with the recess 23 of the piezoelectric substrate 20 in the reinforcing substrate 50, and removing the sacrificed layer from the penetration hole.

Hence, according to the above method, the sacrificed layer can be removed using the penetration hole provided to communicate with the recess, though the structures of the first and second embodiments in which the boxlike recess is provided in the piezoelectric substrate 20 or the reinforcing substrate 50.

Fourth Manufacturing Method

Next, a fourth method for manufacturing a Lamb wave type high frequency device of the invention is explained with reference to a figure. The fourth method is for the Lamb wave type high frequency device having the same structure of the Lamb wave type high frequency device 110 of the third embodiment shown in FIG. 5, but the sacrificed layer is made of $SiO_2$. The major difference from the third embodiment is explained. FIGS. 9A to 9F, which show the method for manufacturing the Lamb wave type high frequency device of the third embodiment, are used as a reference.

Figure 12A:
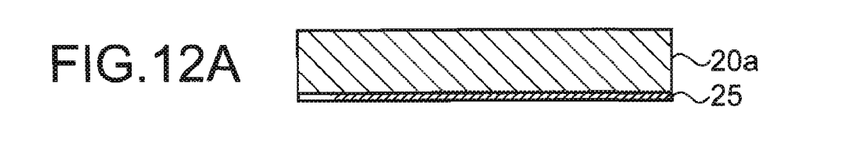
FIGS. 12A to 12D are sectional views schematically showing main processes where $SiO_2$ is used as a sacrificed layer, according to a fourth manufacturing method of the invention.

FIGS. 12A to 12D are sectional views schematically showing main processes where $SiO_2$ is used as a sacrificed layer, according to the fourth manufacturing method. First, as shown in FIG. 12A, a protection layer (may be called as an etching stopper layer) 25 against etching is entirely formed on the back surface of the thick plate 20a made of a quartz substrate. The protection layer 25 is a thin metal layer, and is made of a material, such as Au and Al, which is etched by an etchant different from another etchant for quartz. The protection layer 25 is formed by vacuum evaporation, sputtering or the like.

Figure 12B:
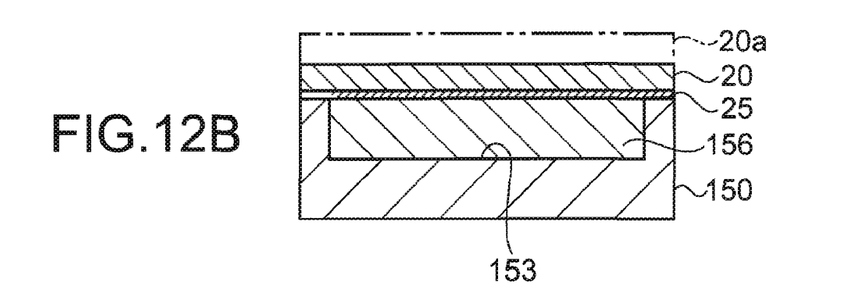

Next, the sacrificed layer 156 made of $SiO_2$ is formed in the recess 153 provided in the reinforcing substrate 150 by CVD or the like (see FIGS. 9A and 9B). After the smoothing process by CMP, as shown in FIG. 12B, the thick plate 20a, which is a quartz substrate on which the protection layer 25 is formed, and the reinforcing substrate 150 in which the sacrificed layer 156 are bonded, and then the thick plate 20a is polished as the quartz substrate 20 having a predetermined thickness.

Figure 12C:
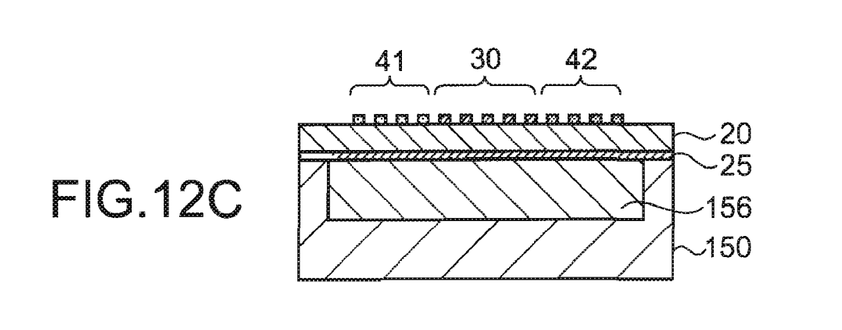

Then, as shown in FIG. 12C, the IDT electrode 30 and reflectors 41 and 42 are formed on the surface of the quartz substrate 20 by photolithography. Next, a resist (not shown) is entirely coated on the surface of the quartz substrate 20 including the IDT electrode 30 and the reflectors 41 and 42, and then the sacrificed layer 156 is removed by etching.

The sacrificed layer 156 is removed using an etchant such as dilute hydrofluoric acid (DHF) and buffered hydrofluoric acid (BHF). In the etching, $SiO_2$ serving as a sacrificed layer is resolved and removed, but the reinforcing substrate 150 made of Si, the surface of the quartz substrate 20 covered with the resist, and the protection layer 25 are not dissolved. Then, the protection layer 25 is removed by etching. The region in which the protection layer 25 is removed may be wider than the area of a Lamb wave propagated. That is, the region extends outside the area in which the IDT electrode 30 and the reflectors 41 and 42 are formed.

Figure 12D:
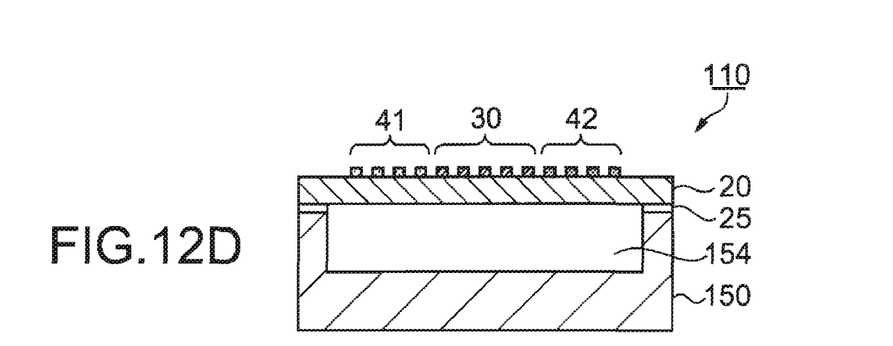

After the resist is removed, the Lamb wave type high frequency device 110 including the space portion 154 formed between the quartz substrate 20 and the reinforcing substrate 150 is completed as shown in FIG. 12D.

Alternatively, the IDT electrode 30 and the reflectors 41 and 42 may be formed by removing the resist followed by removing the sacrificed layer 156 and the protection layer 25.

In the above method, the Lamb wave type high frequency device 110 of the third embodiment, in which the space portion 154 is formed by using the groove-like recess 153, is exemplified. The method, however, can also apply to the Lamb wave type high frequency device 110, which includes the boxlike recess 53, shown in FIGS. 1, 11A and 11B of the first embodiment.

Further, the method can apply to the Lamb wave type high frequency device 210, in which the recess 153 is provided in the quartz substrate 20, of the fourth embodiment shown in FIG. 6. In this case, the protection layer against etching may be formed inside the recess 123.

Hence, according to the fourth manufacturing method, the quartz substrate 20 can be protected in etching the sacrificed layer by providing the protection layer 25 on the back surface, which contacts the sacrificed layer 156, of the quartz substrate 20, though $SiO_2$, which is typically used for a sacrificed layer of MESM structures, is employed for the sacrificed layer.

Fifth Manufacturing Method

Next, a fifth method for manufacturing a Lamb wave type high frequency device of the invention is explained with reference to the drawings. The fifth method is for the Lamb wave type high frequency device having the same structure of the Lamb wave type high frequency device 110 of the third embodiment shown in FIG. 5, but the sacrificed layer is made of a thermosetting resin. The major difference from the third embodiment is explained. FIGS. 9A to 9F, which show the method for manufacturing the Lamb wave type high frequency device of the third embodiment, are also used as a reference.

Figure 13A:
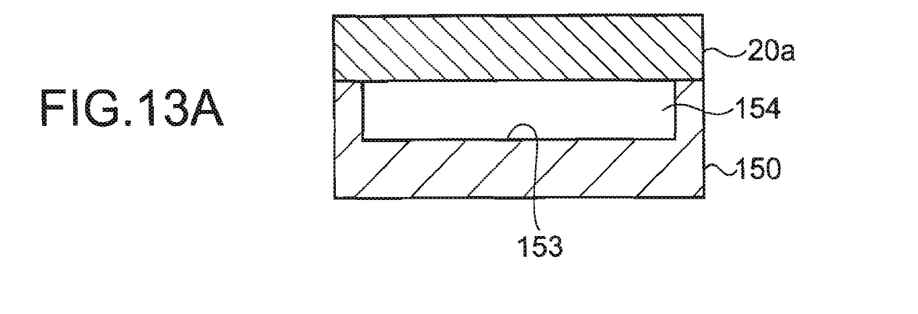
FIGS. 13A to 13C are sectional views schematically showing main processes where a thermosetting resin is used as a sacrificed layer, according to a fifth manufacturing method of the invention.
Figure 13B:
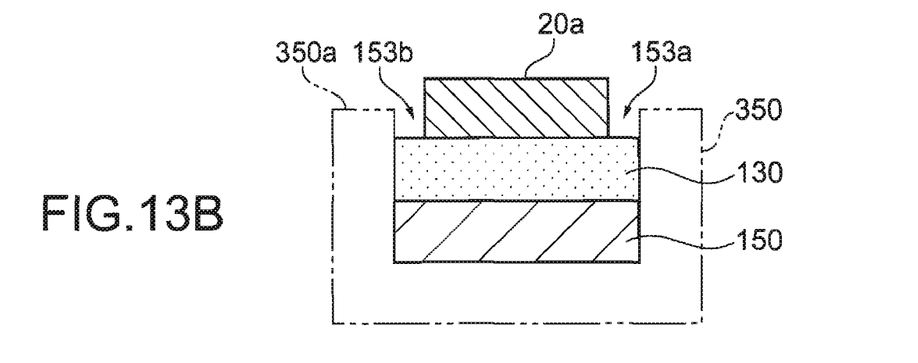
Figure 13C:
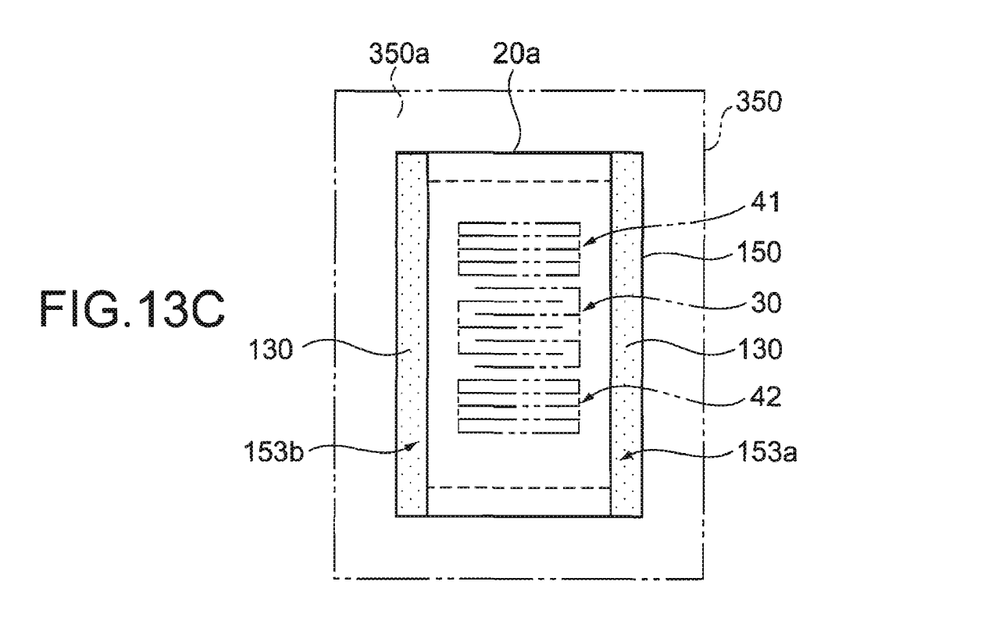

FIGS. 13A to 13C are sectional views schematically showing main processes where a thermosetting resin is used as a sacrificed layer, according to the fifth manufacturing method of the invention. First, as shown in FIG. 13A, the reinforcing substrate 150 including the recess 153 and the thick plate 20a of a quartz substrate are bonded to form the space portion 154 between the reinforcing substrate 150 and the thick plate 20a.

Next, the reinforcing substrate 150 and the thick plate 20a are provided into a setting jig 350 while they are bonded. FIG. 13B is a cross section (width direction) showing a cut surface of the Lamb wave type high frequency device 110 shown in FIG. 5 along a direction perpendicular to the Lamb wave propagation direction. FIG. 13C is a plan view of the Lamb wave type high frequency device 110. In FIGS. 13B and 13C, the reinforcing substrate 150 is formed larger than the thick plate 20a in its width direction, resulting in the both sides of the reinforcing substrate 150 being projected in the width direction. The setting jig 350 surrounds the outer circumference of the reinforcing substrate 150 with a rim portion 350a. The rim portion 350a is protruded over the upper surface of the reinforcing substrate 150.

In the setting jig 350, openings 153a and 153b are formed between the thick plate 20a and the rim portion 360a. The openings 153a and 153b are formed in an end face direction perpendicular to the direction (i.e., Lamb wave propagation direction) along which the IDT electrode 30 and the reflectors 41 and 42 are formed in parallel. From the openings 153a and 153b, a liquid thermosetting resin is injected into the space portion 154 to fill it. As a thermosetting resin, phenol resin, epoxy resin, urea resin, melanin resin, unsaturated polyester resin, polyurethane resin, thermosetting polyimide resin, or the like can be used. The thermosetting resin is cured by heating to form a sacrificed layer 130.

In injecting the thermosetting resin, no bubbles remain inside the space portion 154 by injecting the resin from either one of the opening 113*a* or the opening 153*b* while the other one is suctioned.

After the sacrificed layer 130 is formed, the thick plate 20*a* is polished to a predetermined thickness. Next, the IDT electrode 30 and the reflectors 41 and 42 are formed. Then, the sacrificed layer 130 is removed to complete the Lamb wave type high frequency device 110. Processes after the polishing are as the same processes as shown in FIGS. 9C to 9F. The figures are omitted.

The sacrificed layer 130 can be removed by a solvent or the like introduced from the openings 163*a* and 153*b*. Therefore, the size of the openings 153*a* and 153*b* may be set to any size from which a thermosetting resin is easily injected and a solvent is easily introduced. The setting allows the Lamb wave type high frequency device 110 to be easily taken out from the setting jig 350 after the sacrificed layer 130 is removed.

In addition, the IDT electrode 30 and the reflectors 41 and 42 can be formed after the sacrificed layer 130 is removed. Thus, the IDT electrode 30 and the reflectors 41 and 42 may be formed after taking out the Lamb wave type high frequency device 110 followed by removing the sacrificed layer 130.

Hence, according to the fifth manufacturing method, using a thermosetting resin to the sacrificed layer can inject and fill the resin in the space portion 154 after connecting the thick plate 20*a* with the reinforcing substrate 150. This process does not need expensive manufacturing facilities such as deposition apparatuses and chemical vapor deposition (CVD) apparatuses.

In addition, the surface of the sacrificed layer 130 is flat and smooth since the condition of the back surface of the quartz substrate 20 is transferred on it, resulting in a smoothing process such as CMP not being required. As a result, manufacturing processes can be shortened. Here, the openings 153*a* and 153*b* may be formed in the direction along which the IDT electrode 30, and the reflectors 41 and 42 are formed in parallel.

Sixth Manufacturing Method.

Next, a sixth method for manufacturing a Lamb wave type high frequency device is explained with reference to the drawings. The method is a modification of the fifth manufacturing method. In the method, a thermosetting resin is used for the sacrificed layer 130 and the setting jig is not used.

Figure 14A:
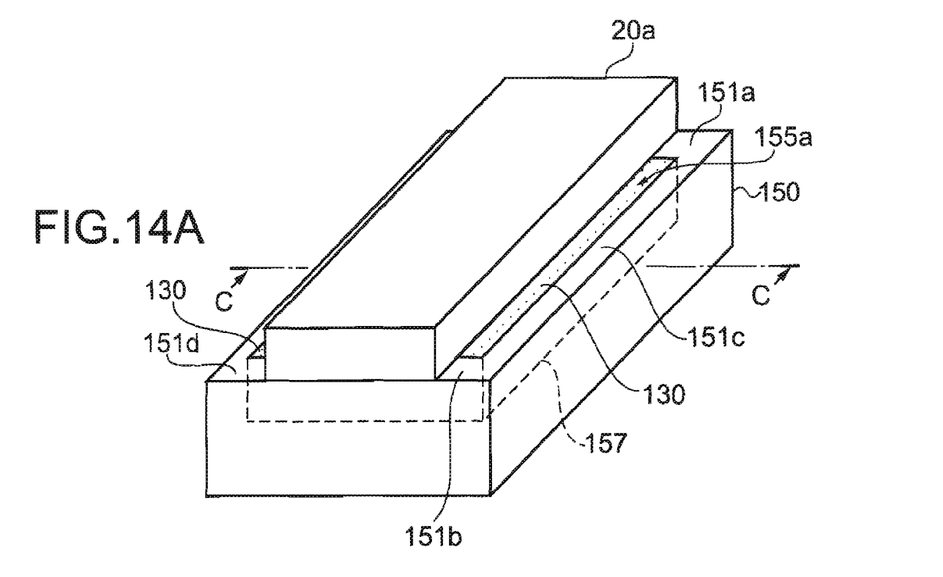
FIG. 14A is a perspective view showing a state after a sacrificed layer is formed.
Figure 14B:
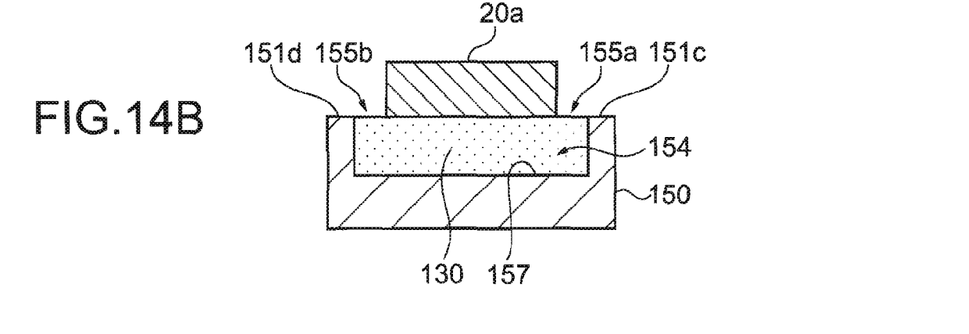
FIG. 14B is a cross section showing C-C cut surface in FIG. 14A.

FIGS. 14A and 14B show the sixth manufacturing method. FIG. 14A is a perspective view showing a state after the sacrificed layer 130 is formed. FIG. 14B is a cross section showing C-C cut surface in FIG. 14A. In FIGS. 14A and 14B, the reinforcing substrate 150 includes a recess 157.

The recess 157 is formed larger than the both sides of the thick plate 20*a* in the width direction. The periphery of the recess 157 is surrounded with 4 rim portions 161*a*, 151*b*, 151*c*, and 151*d*. Therefore, openings 155*a* and 155*b* are formed at the both sides of the thick plate 20*a* in the width direction when the thick plate 20*a* and the reinforcing substrate 150 are bonded.

From the openings 153*a* and 155*b*, a liquid thermosetting resin is injected into the space portion 154 to fill it. The thermosetting resin is cured by heating to form the sacrificed layer 130. After the sacrificed layer 130 is formed, the thick plate 20*a* is polished to a predetermined thickness. Next, the IDT electrode and the reflectors are formed. Then, the sacrificed layer 130 is removed. As a result, the Lamb wave type high frequency device 110 is completed.

The sacrificed layer 130 can be removed by a solvent introduced from the openings 155*a* and 155*b*. Therefore, the size (width) of the openings 165*a* and 155*b* may be set to any size from which a thermosetting resin is easily injected and a solvent is easily introduced.

Hence, according to the sixth manufacturing method, the same effect of the fifth manufacturing method can be achieved without the setting jig since the thermosetting resin can be held in the recess 157 of the reinforcing substrate 150 with rim portions 161*a* to 151*d* when the thermosetting resin is injected into the space portion 154. Here, the openings 153*a* and 153*b* may be formed in the direction along which the IDT electrode 30 and the reflectors 41 and 42 are formed in parallel.

Seventh Manufacturing Method

Next, a seventh method of manufacturing a Lamb wave type high frequency device is explained with reference to a figure. The method is a modification of the sixth manufacturing method. In the method, the reinforcing substrate includes a boxlike recess. The Lamb wave type high frequency device has the same configuration as that has in the first embodiment. The method is characterized in that a thermosetting resin is used for the sacrificed layer compared to the method shown in FIG. 11. Only the major difference from the sixth manufacturing method is explained.

Figure 15:
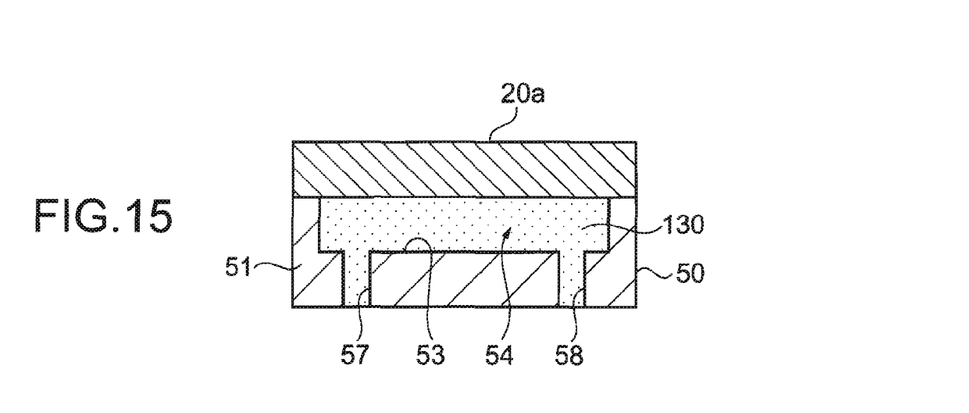
FIG. 15 is a sectional view showing a state where the sacrificed layer made of thermosetting resin is formed according to a seventh manufacturing method of the invention.

FIG. 15, which shows the seventh manufacturing method, is a sectional view schematically showing a state in which the sacrificed layer 130 made of a thermosetting resin is formed. In FIG. 15, the reinforcing substrate 50 includes the boxlike recess 53. The recess 53 forms the space portion 54 closed by the rim portion 51 when the thick plate 20*a* of a quartz substrate is bonded.

In the bottom surface of the recess 53, penetration holes 57 and 58 communicating the inside of the space portion 54 with the outside of the space portion 54 are provided in the reinforcing substrate 50. A liquid thermosetting resin is injected into the space portion 54 from either one of the penetration hole 57 or the penetration hole 58 while the other one is opened or suctioned. After the space portion 54 is filled with the thermosetting resin, the resin is cured by heating to form the sacrificed layer 130. After the sacrificed layer 130 is formed, the thick plate 20*a* is polished to a predetermined thickness, the IDT electrode and the reflectors are formed, and the sacrificed layer 130 is removed in order. As a result, the Lamb wave type high frequency device is completed.

Removing the sacrificed layer 130 uses penetration holes 57 and 58 provided in the reinforcing substrate 50. After removing the sacrificed layer 56, the space portion 54 is communicated with the penetration holes 57 and 58 (not shown).

In FIG. 15, two penetration holes 57 and 58 are provided. But, the number of holes is not limited to two. Further, the shape of a penetration hole is not limited, including a circle and a square.

Hence, according to the seventh manufacturing method, the same effect of the fifth and sixth manufacturing methods is obtained and the setting jig used in the fifth manufacturing method is not required. In addition, rim portions, which hold the liquid thermosetting resin, shown in the sixth manufacturing method is not required since the planar shape of the quartz substrate 20 and the reinforcing substrate 50 coincide with each other. As a result, the device can be miniaturized.

Further, the penetration holes 57 and 58 can be sealed after the space portion 54 is filled with a liquid or gas. As such, the reflection condition of a Lamb wave at the back surface can be changed by forming the interface of the back surface of the quartz substrate 20 with a liquid or gas, enabling the options of resonance modes to be widened.

It should be understood that the invention is not limited to the above-mentioned embodiments. Various modifications and improvements can be made without departing from the spirit and scope of the invention.

For example, while the quartz substrate is exemplified as a piezoelectric substrate in the above embodiments, piezoelectric substrates such as lithium tantalite, lithium niobate, lithium tetraborate, langasite, langanite, and kalium niobate, and other non-piezoelectric substrates can be used.

In addition, piezoelectric thin films such as zinc oxide, aluminum nitride, and tantalum pentoxide, and piezoelectric semiconductors such as cadmium sulfide, zinc sulfide, gallium arsenic, and indium antimonide can be applied to a piezoelectric substrate according to the above manufacturing methods in which a sacrificed layer is formed.

Further, while the one-port resonator is exemplified as a Lamb wave type high frequency device in the above embodiments, a two-port resonator or a filter provided with an IDT electrode and reflectors can be applied to a Lamb wave type high frequency device.

Hence, according to the invention, a Lamb wave type high frequency device that has a high structural strength and can realize stable characteristics, and a manufacturing method with an improved yield in which the device is uneasily broken can be provided.

The entire disclosure of Japanese Patent Application Nos: 2006-039297, filed Feb. 16, 2006 and 2006-209507, filed Aug. 1, 2006 are expressly incorporated by reference herein.

What is claimed is:

1. A Lamb wave type high frequency device, comprising:
a piezoelectric substrate;
an interdigital transducer (IDT) electrode formed on a first main surface of the piezoelectric substrate;
a reinforcing substrate connected to a second main surface of the piezoelectric substrate;
a space portion formed in one of the piezoelectric substrate and the reinforcing substrate, an area of the space portion being larger than a region in which a Lamb wave is propagated, the space portion being formed by a groove-like recess arranged in one of the piezoelectric substrate and the reinforcing substrate, and an opening of the space portion being arranged in a pair of opposite side surfaces of the one of the piezoelectric substrate and the reinforcing substrate; and
a connecting surface formed in a periphery of the space portion.

2. The Lamb wave type high frequency device according to claim 1, wherein the piezoelectric substrate is a quartz substrate.

3. A Lamb wave type high frequency device, comprising:
a piezoelectric substrate;
an interdigital transducer (IDT) electrode formed on a first main surface of the piezoelectric substrate;
a reinforcing substrate connected to a second main surface of the piezoelectric substrate;
a space portion formed in one of the piezoelectric substrate and the reinforcing substrate, an area of the space portion being larger than a region in which a Lamb wave is propagated, the space portion being formed by a groove-like recess arranged in one of the piezoelectric substrate and the reinforcing substrate, and an opening of the space portion being arranged in a pair of opposite side surfaces of the one of the piezoelectric substrate and the reinforcing substrate;
a connecting surface formed in a periphery of the space portion; and
a package having a case and a lid and air-tightly sealing the piezoelectric substrate and the reinforcing substrate.

4. The Lamb wave type high frequency device according to claim 3, wherein a connecting electrode formed within the case is connected with a plurality of pads formed at least on a bus bar included in the IDT electrode.

* * * * *